SUPERCONDUCTOR CIRCUIT WITH PROTUBERANCES

Filed Jan. 13, 1964 3 Sheets-Sheet 1

INVENTOR.
STANLEY P. FRANKEL
BY
Louis P. Elbinger
ATTORNEY

INVENTOR.
STANLEY P. FRANKEL

BY

ATTORNEY

INVENTOR.
STANLEY P. FRANKEL
BY
ATTORNEY

United States Patent Office 3,296,459
Patented Jan. 3, 1967

3,296,459

SUPERCONDUCTOR CIRCUIT WITH PROTUBERANCES

Stanley Phillips Frankel, Los Angeles, Calif., assignor to General Electric Company, a corporation of New York Filed Jan. 13, 1964, Ser. No. 337,322
3 Claims. (Cl. 307—88.5)

This invention relates to superconductor circuits and, more particularly, to superconductor gating and switching circuits characterized by small control currents and rapid gating and switching speeds.

Metallic materials are to various degrees capable of conducting electricity. It is well known that as the temperature of these materials is reduced their resistance to the passage of electricity decreases. Although the resistance of many metallic materials reaches a low, but finite, value at absolute zero temperature (0° K.), certain metallic elements and alloys behave quite differently at temperatures close to absolute zero, usually below 20° K. In these latter materials the resistance abruptly decreases from some finite value to zero, and the materials are called "superconductors." For example, thin films of lead exhibit zero resistance in the range 0° K. to 7.2° K., whereas thin films of tin exhibit zero resistance in the range 0° K. to 3.8° K.

The temperature at which the resistance of a superconductor abruptly drops to zero is defined as the "critical temperature." The resistance of a superconductor at temperatures immediately above the critical temperature is termed the "normal resistance." Thus, as a superconductor is cooled its resistance changes from the normal resistance to zero resistance as the critical temperature is passed. As a superconductor is heated its resistance returns to the normal state when its critical temperature is exceeded.

If an increasing magnetic field is applied to a superconductor while it is operating below its critical temperature, the resistance thereof remains zero until the field reaches a particular value known as a "critical field" for that material. When the value of such critical field is exceeded, the normal resistance of at least a portion of the material returns. Conversely, the resistance of a superconductor returns to zero when the magnetic field is lowered below this critical value.

One type of device employing superconductors and suitable for use as a current gate or switch is the "cryotron." A cryotron is a four-terminal superconductor device in which a magnetic field, produced by passing a current between two input terminals, controls the resistance between two output terminals. In one form of cryotron, known as the cross-film cryotron, a wide "gate" superconductor film, such as tin, on a glass substrate is crossed by a narrow insulated "control" superconductor film, such as lead. The cryotron is operated at a temperature such that the control is always superconducting, but wherein the magnetic field accompanying passage of a predetermined value of current through the control transfers an adjacent portion of the gate to its normal resistance state. Thus, a quantity of current flowing in the gate may be switched off or on in accordance with the presence or absence of a control current which may be of smaller value than the gate current.

Two parameters which are a measure of the utility of a cryotron circuit are its gain and its time constant. The gain is a relationship between the maximum current that the gate can carry while remaining superconducting and the control current required to provide the required resistance in the adjacent gate portion. The time constant is a measure of the time required to halt the flow of current in the gate and transfer such current to a load, upon application of a critical magnetic field to the gate. The gain and time constant are interdependent quantities, so that for particular type of cryotron physical changes to increase the gain will be accompanied by a decrease in the time constant and vice versa. It is desirable that a cryotron circuit possess the optimum combination of a large gain and a small time constant.

Accordingly, it is the principal object of this invention to provide an improved cryotron circuit characterized by optimum values of time constant and gain.

Another object of this invention is to provide an improved superconductor switching circuit.

Another object of this invention is to provide an improved superconductor gate.

Another object of this invention is to provide an improved crossed-film cryotron.

The foregoing objects are achieved by providing, in a cryotron of the type described, a structure that functions to provide a multiplicity of penetrations of the gate by the magnetic field of the current in the control. A portion of a first superconductor film, the control, is disposed adjacent to, but insulated from a portion of a second superconductor film, the gate. Means is provided to produce a flow of current in the control to change the resistive state of the gate. According to one embodiment of the instant invention, the gate portion is provided with a plurality of deformations, the size of the deformations being relatively small compared with the width of the control. The deformations function to provide a plurality of magnetic field penetrations of the gate. Thus, there is provided a spatially periodic magnetic field penetration of the gate, the periodicity of the penetration occurring in a direction along the length of the gate. This periodic penetration provides for resistive control of the gate with a smaller control current than that of prior art devices, thus providing for optimum cryotron circuit gain and time constant.

The invention will be described with reference to the accompanying drawings wherein.

Figure 1:
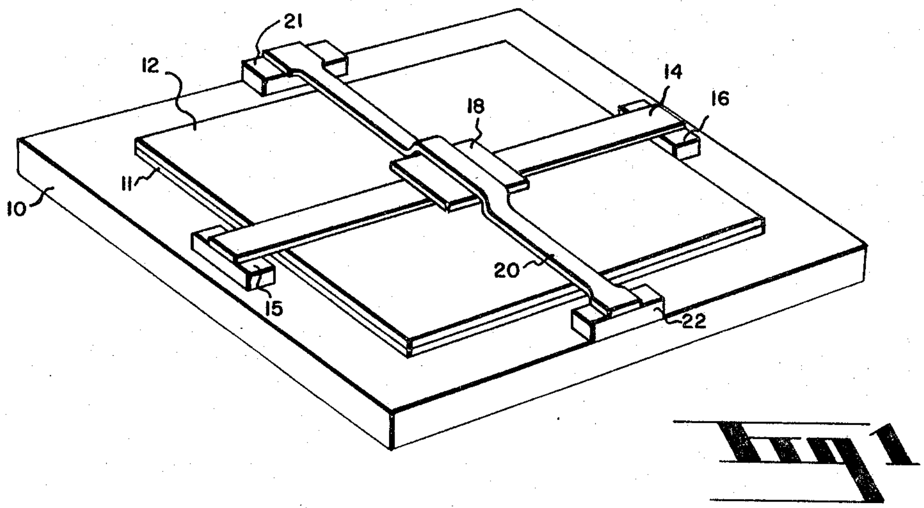
FIGURE 1 is a perspective view of a crossed-film cryotron embodiment of the invention.

The shielded crossed-film cryotron of FIG. 1 is formed on a base member 10, or substrate, of glass. A shield 11, formed of a thin film of superconductor material, such as lead, covers a portion of substrate 10. Shield 11 may be formed by evaporation of the lead material thereof onto substrate 10. An insulating layer 12, composed of an electrically insulating material, such as silicon monoxide, may be formed by evaporation of the material thereof onto shield 11.

A pair of superconductor strips and their associated terminals complete the structure of the crossed-film cryotron of FIG. 1. One such superconductor strip 14, termed the "gate," is formed of a thin film of superconductor material, such as tin, and is disposed above insulating layer 12. A pair of terminals 15 and 16, composed of lead and formed directly on substrate 10, provide for connection of a source of electric current to gate 14. Gate 14 may be formed by evaporation of the tin material thereof onto insulating layer 12 and terminals 15 and 16 through a suitable aperture in a mask. Thus, gate 14 is electrically connected at both ends thereof to terminals 15 and 16. A second insulating layer 18, composed of an electrically insulating material, such as silicon monoxide, may be formed by evaporation of the material thereof onto the central portion of gate 14. A second superconductor strip 20, termed the "control," formed of a thin film of superconductor material, such as lead, crosses a portion of gate 14 and is insulated therefrom by insulating layer 18. A pair of terminals 21 and 22, composed of lead and formed directly on substrate 10, provide for connection of a source of electric current to control 20. Control 20 may be formed by evaporation of the lead material thereof onto portions of insulating layers 12 and 18 and terminals 21 and 22 through a suitable aperture in a mask. Thus, control 20 is electrically connected at both ends thereof to terminals 21 and 22.

The entire cryotron is immersed in a suitable low temperature environment, which for the specific materials employed herein is maintained slightly below 3.8° K. The temperature of the cryotron is thus slightly below the critical temperature of tin and substantially below the critical temperature of lead. It is well known that the further a superconductor material is cooled below its critical temperature, the greater the corresponding critical magnetic field. Accordingly, tin components in the instant cryotron are transferred between normal and superconductor states by relatively low intensities of magnetic field, whereas lead components require relatively high intensities of magnetic field to similarly switch. Therefore, for the values of magnetic field intensities experienced in the cryotron of FIG. 1, the shield 11, control 20, and terminals 15, 16, 21, and 22, all of lead, continuously function as superconductors. However, a portion of the tin gate 14, according to the instant invention, is subjected to magnetic fields of different intensities, some of which are sufficient to transfer the gate from the superconducting state to the normal state.

In operation, the crossed-film cryotron of FIG. 1 functions as a gating or switching circuit. The electric current to be gated, or switched off and on, flows through gate 14 upon appliaction of an electric current source, not shown, to terminals 15 and 16. Electric current for controlling the gating or switching function is carried by control 20 upon application of another electric current source, not shown, to terminals 21 and 22. The current flowing through control 20 is accompanied by a magnetic field which surrounds the control and thereby couples to gate 14. If the current carried by control 20 provides a magnetic field at the surface of gate 14 equal to or greater in value than a critical field for the gate at the temperature at which it is held, a portion of gate 14 below control 20 returns to its value of normal resistance. The return of this portion of gate 14 to its normal resistance value inhibits or stops the flow of current through the gate. Thus, in response to an appropriate current in control 20, a switching or gating action by gate 14 is displayed in the cryotron of FIG. 1.

Figure 2:
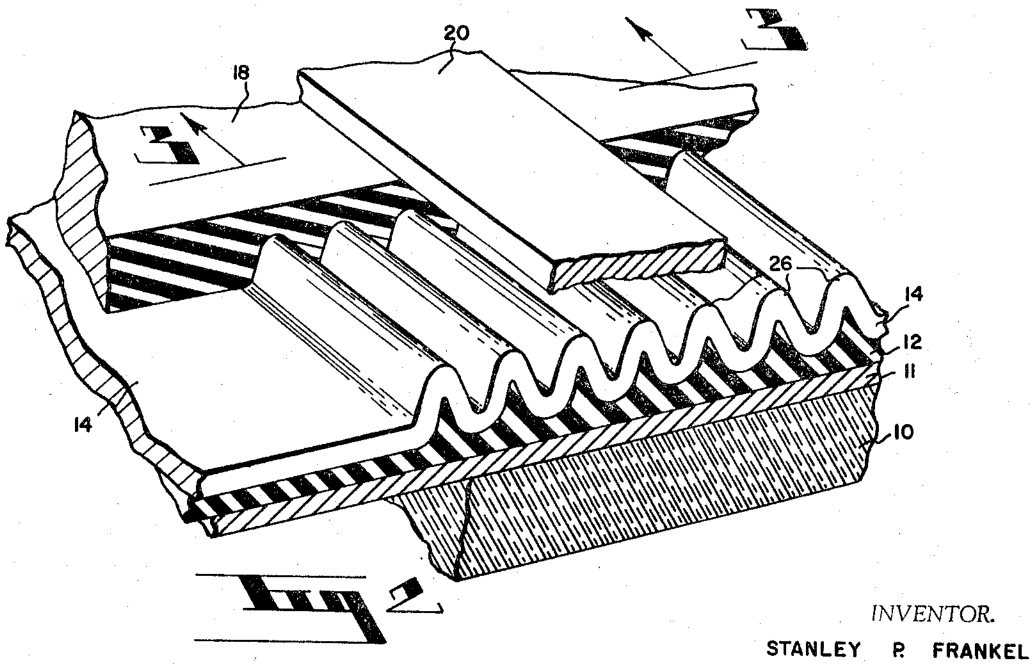
FIGURE 2 is an enlarged perspective view, partly in cross-section, of a portion of FIG. 1.
Figure 3:
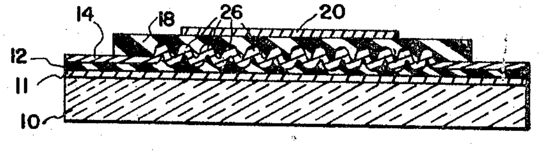
FIGURE 3 is a cross-sectional view of the embodiment of FIG. 2.

Details of the construction of the cryotron of FIG. 1, illustrating one embodiment of the instant invention, are provided in FIGS. 2 and 3. In this embodiment gate 14 is provided with a plurality of deformations, such as ridges 26, extending across the width of the gate in that portion thereof opposite control 20. According to one method, ridges 26 may be formed by evaporation of the lead film of gate 14 onto an insulating layer 12 provided with previously formed ridges. Since it is desirable that a plurality of ridges 26 be provided to underly control 20, the distance between ridges, and consequently the size of each ridge, should be small compared with the width of control 20. Instead of ridges 26, gate 14 may comprise a multiplicity of deformations, such as protuberances or nodules, under control 20, and the cryotron of FIGS. 1–3 will continue to function in accordance with the principles of the instant invention. Similarly to ridges 26, these protuberances or nodules should be small compared with the width of control 20. A cryotron constructed with ridges or nodules as described provides for resistive control of the gate with a smaller current in the control than is required in comparable prior art cryotrons having a smooth-surfaced gate or provides for a shorter time constant for the cryotron circuit than is provided by the smooth-surfaced gate of the prior art.

The operating efficacy of a cryotron may be expressed in terms of a figure-of-merit, which if improved permits improvement in a particular characteristic without impairing the other characteristics. This figure-of-merit, which may be represented by the symbol F*m*, is defined by the following expression:

$$Fm=K\frac{G^2}{T}$$

where G is the gain of the cryotron and T is its time constant. The gain defines the ratio of amount of output gate current the cryotron controls to the control current required. Generally as large a gain as possible is desired. The time constant is a measure of the rapidity of response of the cryotron. Generally, in high speed electronic circuits of the type wherein cryotrons are employed, as small a time constant as possible is desired. However, for a given type of cryotron the figure-of-merit is constant.

Thus, if the cryotron gain is increased by a factor of two, as by doubling the gate width, to double the allowable gate current, the time constant is automatically increased by a factor of four, due to the consequent halving of gate resistance and doubling of control inductance. The cryotron time constant is directly proportional to control inductance and inversely proportional to gate resistance. This effect is represented by the above equation for F*m*, wherein the constant figure-of-merit for the given type of cryotron requires that if the gain is increased by a given fraction, the time constant is automatically increased by an amount proprotional to the square of that fraction. Thus, in a given type of cryotron, such as those illustrated in FIG. 1 and having a smooth-surfaced gate, any improvement in either one of the characteristics of time constant or gain is attended by a consequent deterioration in the other one of the characteristics. The instant invention provides a cryotron with a larger figure-of-merit than prior art cryotrons, such as ones having the smooth surfaced gate described heretofore, and, accordingly provides for an increase in gain or a decrease in time constant over the prior art devices without a consequent deterioration of the other one of these characteristics.

Figures 4, 5:
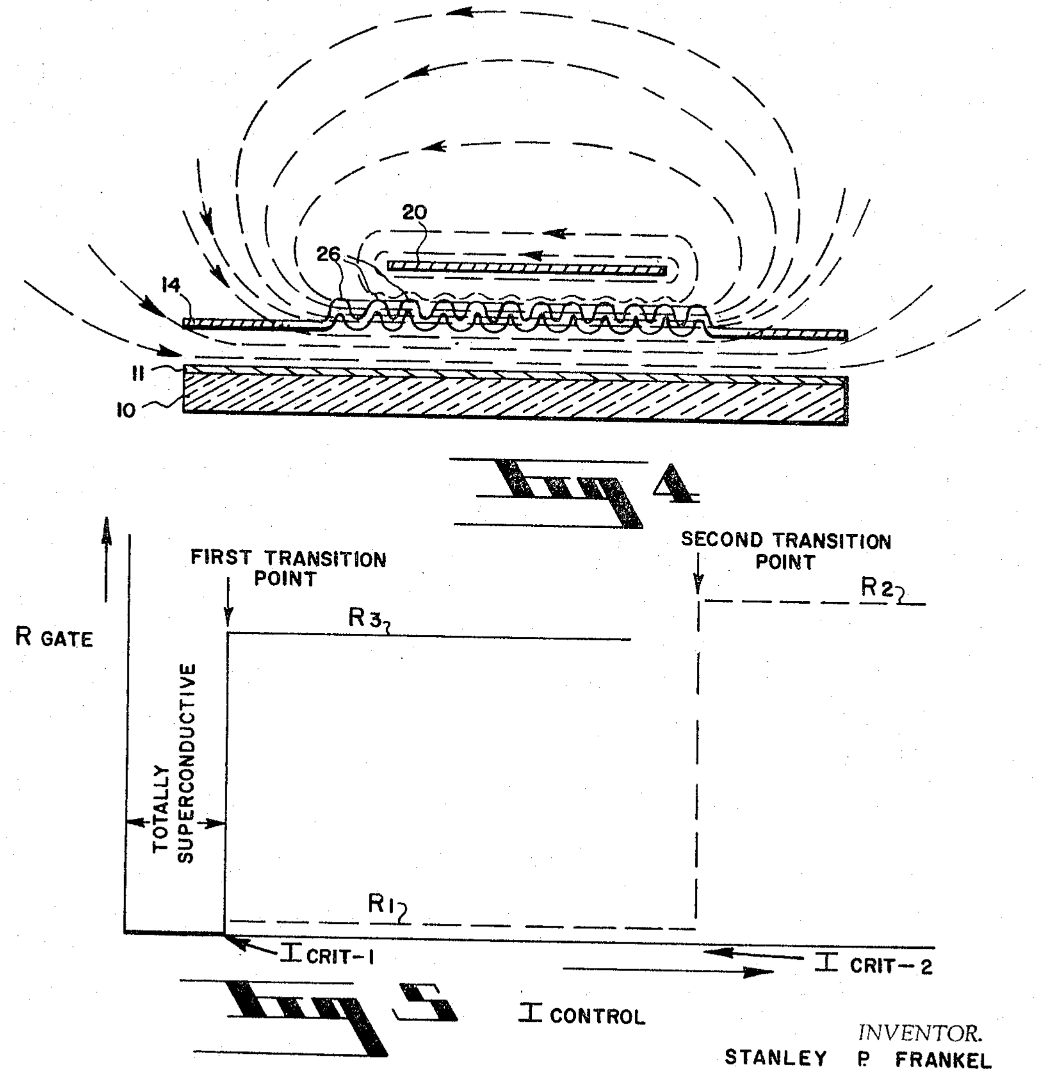
FIGURE 4 illustrates the magnetic field configuration produced by current in the control of the embodiment of FIGS. 2 and 3.
FIGURE 5 is a graph illustrating the theory of operation of the invention.

The theory of operation of the invention, as presently understood, will now be described by reference to FIGS. 4 and 5. FIGURE 4 is dimensionally distorted for simplicity, and insulating layers 12 and 18 have been omitted. FIGURE 4 illustrates the magnetic field configuration, shown by dashed lines, for one value of current in control 20. Consider, first, the theory of operation of the prior art cryotrons, wherein both the gate and control are smooth-surfaced. For small values of current in the control, most of the magnetic field produced by the control current lies substantially parallel to and immediately under the lower control surface, curling around the edge of the control to form closed loops above it; such as the innermost loop shown encircling control 20 in FIG. 4. The gate, being a superconductor, functions as a magnetic barrier, and resists penetration of the magnetic fields through the surface thereof. However, because the gate is a very thin film, it cannot prevent penetration of all of the magnetic field flux and, accordingly even with small control currents, some magnetic field loops penetrate the gate. These loops, such as the outermost loops in FIG. 4 penetrate the gate opposite each edge of the control, lie essentially parallel to the lower surface of the gate between gate 14 and shield 11, and curl around the edges of and over control 20. The gate, in the presence of these small control currents, remains completely superconducting. The range of small control currents for which the gate is totally superconducting is shown in the left-hand region of FIG. 5. In this region the gate resistance is zero.

As the current in the control is increased in the totally superconducting region, the total magnetic flux surrounding the control increases correspondingly and the amount of flux penetrating the gate opposite each edge of the control increases. When the control current is increased to a particular value, designated as $I_{CRIT-1}$ in FIG. 5 a first transition occurs wherein the increasingly concentrated magnetic flux penetrating the gate opposite the two edges of the control forces the gate to suddenly become normally resistive. The gate becomes normally resistive along two narrow bands extending across the width of the gate opposite each edge of the control. Accordingly, the total gate resistance increases a very small, but perceptible, amount to a value such as R1 in FIG. 5. The dashed line in FIG. 5 illustrates the value of gate resistance versus control current for the prior art cryotrons.

At the first transition point caused by the control current $I_{CRIT-1}$ the cryotron is characterized by a relatively large gain and a relatively large time constant. The large gain is due to the switching of the gate current with a very small control current at this transition point. The large time constant is due to the very small amount of resistance induced in the gate. The large time constant and small resistance change of the cryotron renders it generally unsuitable for practical use at this first transition point.

The narrow, normally resistive, bands of the gate of this first transition point do not provide a barrier to the penetration of magnetic flux and a substantial portion of the flux provided by the control now penetrates the gate through these bands. The amount of magnetic flux now penetrating the gate and lying between gate and shield becomes comparable to the amount of flux which does not penetrate the gate but lies between the control and gate. With comparable magnetic fields lying parallel to the gate and on both sides thereof, further transitions of areas of the gate to the normally resistive state do not readily occur even though the control current is increased well above the first critical value $I_{CRIT-1}$.

If the control current is increased to a relatively large value $I_{CRIT-2}$, a second transition occurs wherein the entire gate area lying below the control suddenly becomes normally resistive. Accordingly, the total gate resistance increases abruptly to a relatively large value, R2. At this second transition point the cryotron is characterized by a relatively small gain and a relatively small time constant. The small gain is due to the controlling of the gate current with a relatively large control current at this second transition point. The relatively small time constant is due to the large resistance induced in the gate. It is this second transition point at which the prior art cryotrons are normally operated to effect switching of the gate current.

In the above description of operation of the prior art cryotrons, it was noted that although large gate resistance and small time constant are obtained at the second transition point, they are achieved at the expense of gain. The gain at the second transition point is very much less than that at the first transition point. The instant invention obtains resistances and time constants comparable to those obtained at the second transition point of the prior art cryotrons, but which gains comparable in magnitude to the large gains achieved by these prior art cryotrons at the first transition point.

The instant invention provides that much of the gate area opposite the control becomes normally resistive for relatively small values of control current. This improvement is due to the deformations or ridges in the gate of the embodiment of FIGS. 2 and 3, each of these ridges providing for separate penetrations thereof by the magnetic field of the control. Consider, now, the configuration of the magnetic field in FIG. 4 for small values of control current. Since gate 14 functions as a superconductor, once again for small values of control current much of the magnetic field will not penetrate the surface of the gate, but instead, those fields lying between control 20 and gate 14 will follow above the upper surfaces, or crests, of ridges 26 with a slightly undulatory configuration; this configuration being represented in FIG. 4 by the undulatory magnetic field shown immediately above the crests of ridges 26. These fields between control and gate curl around the edges of the control to form closed loops above it.

However, again because the gate is a very thin film, it cannot prevent penetration of all of the magnetic field flux and, accordingly, even with small control currents, some magnetic field loops penetrate the gate. Some of these loops penetrate both walls of many of ridges 26. Each of the ridges is penetrated on both walls thereof by some of the field loops. Additionally, some of the loops penetrate the gate area outside the ridged region. Thus, it is seen that the magnetic field provided by the control of the invention has components perpendicular to the gate surface in a multiplicity of regions of the gate. Each of the magnetic field loops which penetrates the gate emerges therefrom to curl around the edges of and over control 20. The gate, in the presence of these small control currents remains completely superconducting. The range of small control currents for which the gate remains totally superconducting is shown also to be in the left-hand region of FIG. 5. In this region the gate resistance is zero.

As the current in the control is increased in the totally superconducting region the total magnetic flux surrounding the control increases correspondingly and the amount of flux penetrating the gate on the walls of ridges 26 and the gate area outside the ridged region increases. When the control current is increased to a value approximately equal to $I_{CRIT-1}$, a major transition occurs wherein the increasingly concentrated magnetic flux penetrating the various portions of the gate forces the gate to become normally resistive. The gate becomes normally resisitive along a multiplicity of bands extending across the width of the gate, these bands occurring on both walls of the ridges 26 and on the gate area outside the ridged region. Accordingly, the total gate resistance increases abruptly to a relatively large value, R3, a resistance value of the same order of magnitude as R2. The solid line in FIG. 5 illustrates the value of gate resistance versus control current for the cryotron of the instant invention.

The major transition of the cryotron of the instant invention at the control current $I_{CRIT-1}$ provides a cryotron characterized by a relatively large gain and a relatively small time constant. The large gain is due to the switching of the gate current with a very small control current at the major transition. The small time constant is due to the large resistance induced in the gate.

Thus, the cryotron of the instant invention provides both a large gain, comparable to the large gain provided by the first transition of the prior art cryotron, and a large gate resistance and small time constant, comparable to the large gate resistance and small time constant provided by the second transistor of the prior art cryotron. Accordingly, by combining these two desirable characteristics, not both obtainable under the same conditions of operation in the prior art device, the instant invention provides a cryotron having a substantially greater figure-of-merit than the prior art.

Figure 6:
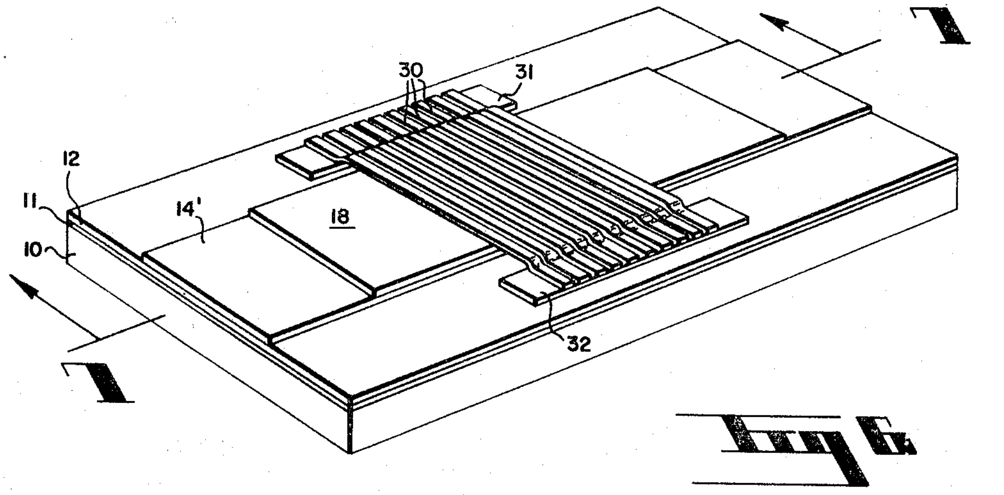
FIGURE 6 is a perspective view of another embodiment of the invention.
Figure 7:
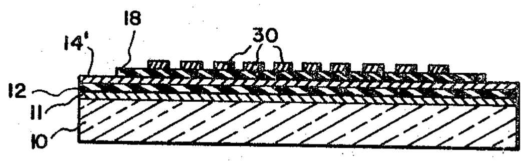
FIGURE 7 is a cross-sectional view of the embodiment of FIG 6.

Details of the construction of the cryotron of FIG. 1, illustrating another embodiment of the instant invention, are provided in FIGS. 6 and 7. In this embodiment the control comprises a plurality of very narrow parallel separated elements, or strips, 30, the plurality of strips 30 carrying the total control current. A pair of terminals 31 and 32, composed of lead and formed on insulating layer 12 provide for the parallel connection of strips 30 to a source of electric current. The control may be formed by evaporation of the lead material of the individual strips 30 onto insulating layer 18 and terminals 31 and 32 through a suitably apertured mask. The control may also be formed by evaporation of a unitary film of lead onto insulating layer 18 and terminals 31 and 32, followed by cutting or scribing grooves through the lead film to form the strips 30. If necessary, the depressions between each of terminals 31 and 32 and insulating layer 18 may be filled with electrically insulating material prior to evaporation of the control film material, As in the previously described embodiment, a cryotron constructed with the control comprising a plurality of strips 30 provides a greater figure-of-merit than the prior art cryotrons.

Figure 8:
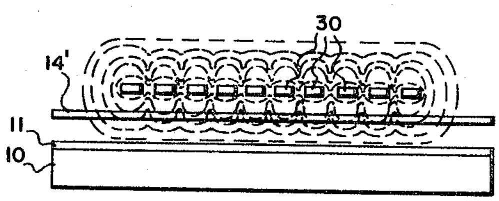
FIGURE 8 illustrates the magnetic field configuration produced by current in the control of the embodiment of FIGS. 6 and 7.

As in the previously described embodiment, the embodiment of FIGS. 6 and 7 provides that much of the area of gate 14 opposite the control becomes normally resistive for relatively small values of control current. FIGURE 8 illustrates the magnetic field configuration, shown by dashed lines, for one value of current in the control. This figure is dimensionally distorted for simplicity, and insulating layers 12 and 18 have been omitted. As shown in FIG. 8, the control current portions in strips 30 provide a strong undulatory magnetic field configuration at the surface of gate 14'. Consider, first, the nature of the magnetic field in FIG. 8 for small values of total control current. Since gate 14' functions as a superconductor, for small values of control current, much of the magnetic field will not penetrate the surface of the gate, but instead, those fields lying between the control and the surface of gate 14 generally follow the cross-sectional pattern of the control, providing an undulatory pattern between control and gate.

However, as in the previously-described embodiment, some of the undulatory-patterned magnetic flux penetrates the gate at a multiplicity of points in a spatially periodic manner. Thus, in FIG. 8, magnetic flux lines are shown penetrating gate 14' opposite both edges of each strip 30. Gate 14', in the presence of the small total control currents, remains totally superconducting. If the control current, however, is increased to a value approximately equal to $I_{CRIT-1}$ in FIG. 5, a major transistion occurs wherein the increasingly concentrated magnetic flux penetrating the various portions of the gate forces the gate to become normally resistive. The gate becomes normally ressitive along a multiplicity of bands extending across the width of the gate, these bands occurring approximately opposite the various edges of the strips 30. As in the instance of the embodiment of FIGS. 2 and 3, the total gate resistance increases abruptly to a relatively large value.

Because of the small control current forcing the large resistance transition of the cryotron of FIGS. 6 and 7, the device is characterized by the same concurrent high gains and small time constants of the previously-described embodiment. Thus, the embodiment of FIGS. 6 and 7 also provides a substantially greater figure-of-merit than the prior art.

In the above-described theory of operation of the embodiment of FIGS. 5 and 6, it was shown that by producing a magnetic field pattern of undulatory form immediately above the surface of a smooth-surfaced gate, a substantial portion of the gate area opposite the control becomes normally resistive for small values of control current. Therefore, it is in accordance with the principles of the instant invention to provide such an undulatory pattern with other forms of structures; for example, by providing deformations, such as the protuberances or nodules described in connection with FIGS. 2 and 3, on the control, rather than on the gate. Passing the current through a control provided with such deformations produces the requisite undulatory magnetic field pattern at the opposed surface of the gate and will, accordingly, provide the desirable multiple field penetrations of the gate surface.

While the principles of the invention have been made clear in the illustrative embodiments, there will be obvious to those skilled in the art many modifications in structure, arrangement, proportions, the elements, materials, and components, used in the practice of the invention, and otherwise, which are adapted for specific environments and operating requirements, without departing from these principles. The appended claims are therefore intended to cover and embrace any such modifications within the limits only of the true spirit and scope of the invention.

What is claimed is:

1. A superconductor circuit comprising: a first superconductor strip, and a second superconductor strip disposed in magnetic coupling relationship with said first superconductor strip, at least one of said strips being formed with a plurality of protuberances for providing a magnetic field penetration of said first strip for each of said deformations when said second strip carries electric current, each of said protuberances being small compared to the width of said second strip, said protuberances being oriented such that a substantial portion of said magnetic field is applied to said protuberances in a direction substantially transverse to the direction of said protuberances.

2. A superconductor circuit comprising: a first superconductor strip forming a gate, a second superconductive strip forming a control, and means for providing electric current in said second strip, said second strip being disposed in proximity to said first strip for the magnetic field produced by said current to couple to the first strip, said second strip comprising a plurality of electrically parallel spaced elemental strips, said elemental strips being oriented with respect to said first strip to direct a substantial portion of said magentic field in a direction perpendicular to said first strip.

3. A superconductor circuit comprising: a first superconductor strip forming a gate, a second superconductor strip forming a control, and means for providing electric current in said second strip, said second strip being disposed in proximity to said first strip for the magnetic field produced by said current to couple to the first strip, said first strip being formed with a plurality of ridged deformations, each of said ridged deformations being relatively small compared with the width of said second strip, said deformations being oriented such that a substantial portion of said magnetic field is applied to said deformations in a direction substantially transverse to said deformations.

References Cited by the Examiner

UNITED STATES PATENTS

| | | | |
|---|---|---|---|
| 2,966,647 | 12/1960 | Rentz | 307—88.5 |
| 3,115,612 | 12/1963 | Meissner | 332—32 |

FOREIGN PATENTS 908,704 10/1962 Great Britain.

OTHER REFERENCES

Proceedings of the IRE, "Thin Film Cryotrons," by Smallman et al., Part I, pages 1560–1568, September 1960.

ARTHUR GAUSS, *Primary Examiner.*

B. P. DAVIS, *Assistant Examiner.*